(12) United States Patent
Lee et al.

(10) Patent No.: US 8,729,687 B2
(45) Date of Patent: May 20, 2014

(54) STACKABLE INTEGRATED CIRCUIT PACKAGE SYSTEM

(71) Applicant: STATS ChipPAC Ltd., Singapore (SG)

(72) Inventors: Hun Teak Lee, Seongnam-si (KR); Tae Keun Lee, Ichon-si (KR); Soo Jung Park, Icheon-si (KR)

(73) Assignee: STATS ChipPac Ltd., Singapore (SG)

( * ) Notice: Subject to any disclaimer, the term of this patent is extended or adjusted under 35 U.S.C. 154(b) by 0 days.

(21) Appl. No.: 13/649,834

(22) Filed: Oct. 11, 2012

(65) Prior Publication Data

US 2013/0032954 A1 Feb. 7, 2013

Related U.S. Application Data

(63) Continuation of application No. 11/608,826, filed on Dec. 9, 2006, now Pat. No. 8,304,874.

(51) Int. Cl.
*H01L 23/538* (2006.01)
*H01L 23/31* (2006.01)
*H01L 21/56* (2006.01)
*H01L 25/065* (2006.01)

(52) U.S. Cl.
CPC .............. *H01L 23/31* (2013.01); *H01L 23/315* (2013.01); *H01L 21/568* (2013.01); *H01L 25/0657* (2013.01)
USPC ................... 257/686; 257/777; 257/E21.518; 257/E23.18; 438/106

(58) Field of Classification Search
USPC ......... 257/666, 739, 777, 774, 773, 784, 723, 257/787, 730, 697, E23.046, E23.004, 257/E23.124, E23.013, E23.069, E23.129, 257/E23.123, E23.18, E21.516, E23.001; 438/106–108, 109, 125–126
See application file for complete search history.

(56) References Cited

U.S. PATENT DOCUMENTS

| | | | |
|---|---|---|---|
| 5,309,026 A * | 5/1994 | Matsumoto | 257/787 |
| 5,679,978 A * | 10/1997 | Kawahara et al. | 257/697 |
| 5,854,507 A | 12/1998 | Miremadi et al. | |
| 6,072,239 A * | 6/2000 | Yoneda et al. | 257/730 |
| 6,353,265 B1 | 3/2002 | Michii | |
| 6,424,031 B1 * | 7/2002 | Glenn | 257/686 |
| 6,627,480 B2 | 9/2003 | Kim | |
| 6,686,656 B1 | 2/2004 | Koh et al. | |
| 6,753,599 B2 | 6/2004 | Kim | |
| 7,061,087 B2 | 6/2006 | Kim | |
| 7,071,547 B2 | 7/2006 | Kang et al. | |
| 7,078,264 B2 | 7/2006 | Yang | |
| 7,105,919 B2 | 9/2006 | Kim | |
| 7,116,002 B2 | 10/2006 | Chao et al. | |
| 7,196,415 B2 * | 3/2007 | Zhong et al. | 257/712 |
| 7,224,070 B2 | 5/2007 | Yang | |
| 7,622,333 B2 | 11/2009 | Kim et al. | |
| 7,635,913 B2 | 12/2009 | Kim et al. | |
| 7,683,467 B2 | 3/2010 | Jang et al. | |
| 2001/0031513 A1 * | 10/2001 | Masuda et al. | 438/107 |

(Continued)

*Primary Examiner* — Ermias Woldegeorgis
(74) *Attorney, Agent, or Firm* — Ishimaru & Associates LLP

(57) ABSTRACT

A stacked integrated circuit package-in-package system is provided including forming a first external interconnect; mounting a first integrated circuit die below the first external interconnect; stacking a second integrated circuit die over the first integrated circuit die in an offset configuration not over the first external interconnect; connecting the first integrated circuit die with the first external interconnect; and encapsulating the second integrated circuit die with the first external interconnect and the first integrated circuit die partially exposed.

20 Claims, 8 Drawing Sheets

(56) References Cited

U.S. PATENT DOCUMENTS

| | | | |
|---|---|---|---|
| 2002/0033527 A1* | 3/2002 | Huang et al. | 257/687 |
| 2002/0079570 A1* | 6/2002 | Ho et al. | 257/697 |
| 2002/0105069 A1* | 8/2002 | Kawahara et al. | 257/690 |
| 2002/0113325 A1* | 8/2002 | Kim | 257/787 |
| 2005/0067694 A1 | 3/2005 | Pon et al. | |
| 2006/0189033 A1* | 8/2006 | Kim | 438/109 |
| 2007/0278643 A1 | 12/2007 | Yee | |
| 2008/0006925 A1 | 1/2008 | Yim et al. | |
| 2008/0029866 A1 | 2/2008 | Kim et al. | |
| 2008/0029867 A1 | 2/2008 | Kim et al. | |
| 2008/0136006 A1 | 6/2008 | Jang et al. | |

* cited by examiner

STACKABLE INTEGRATED CIRCUIT PACKAGE SYSTEM

CROSS-REFERENCE TO RELATED APPLICATIONS

The present application contains subject matter related to a concurrently filed U.S. patent application Ser. No. 11/608,827, now U.S. Pat. No. 7,772,683. The related application is assigned to STATS ChipPAC Ltd.

The present application also contains subject matter related to a concurrently filed U.S. patent application Ser. No. 11/608,829, now U.S. Pat. No. 7,635,913. The related application is assigned to STATS ChipPAC Ltd.

This is a continuation of allowed U.S. patent application Ser. No. 11/608,826, now U.S. Pat. No. 8,304,874, filed Dec. 9, 2006, and the subject matter thereof is hereby incorporated herein by reference thereto.

TECHNICAL FIELD

The present invention relates generally to integrated circuit packages and more particularly to stacked integrated circuit package-in-package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

Numerous package approaches stack multiple integrated circuit dice or package in package (PIP) or a combination thereof. The electrical connections to the each of the stacked integrated circuit require an increased amount of space from by spacers, such as silicon or interposers, or by the space required for the electrical connections, such as wire loops for bond wires. Current spacers require additional steps and structures increasing manufacturing costs and decreasing manufacturing yields. These spacers also limit the amount of height reduction. Space required for the different electrical connection types limit the overall size, e.g. height, width, and length, of the package.

Thus, a need still remains for a stacked integrated circuit package-in-package system providing low cost manufacturing, improved yield, and decreased size for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable integrated circuit package system including forming a first external interconnect; mounting a first integrated circuit die below the first external interconnect; stacking a second integrated circuit die over the first integrated circuit die in an offset configuration not over the first external interconnect; connecting the first integrated circuit die with the first external interconnect; and encapsulating the second integrated circuit die with the first external interconnect and a first integrated circuit die partially exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
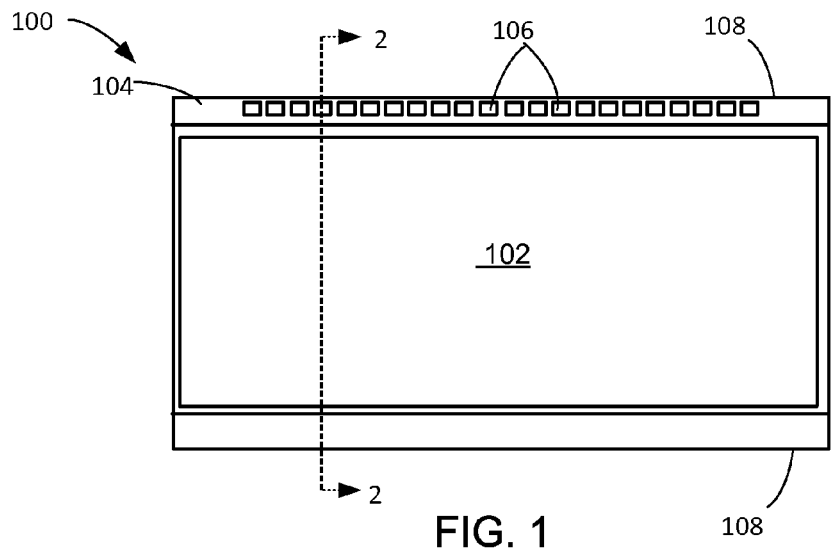
FIG. 1 is a bottom view of a stackable integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown a bottom view of a stackable integrated circuit package system 100 in an embodiment of the present invention. The stackable integrated circuit package system 100, such as an in-line package, has a first device 102, such as an integrated circuit die or a packaged device, exposed in a device encapsulation 104, such as an epoxy mold compound. External interconnects 106, such as lands or terminal pads, are along a package side 108 of the stackable integrated circuit package system 100 in the device encapsulation 104.

For illustrative purposes, the stackable integrated circuit package system 100 is shown having the external interconnects 106 in a single row, although it understood that the stackable integrated circuit package system 100 may have the external interconnects 106 in a different configuration, such as multiple rows along the package side 108.

Figure 2:
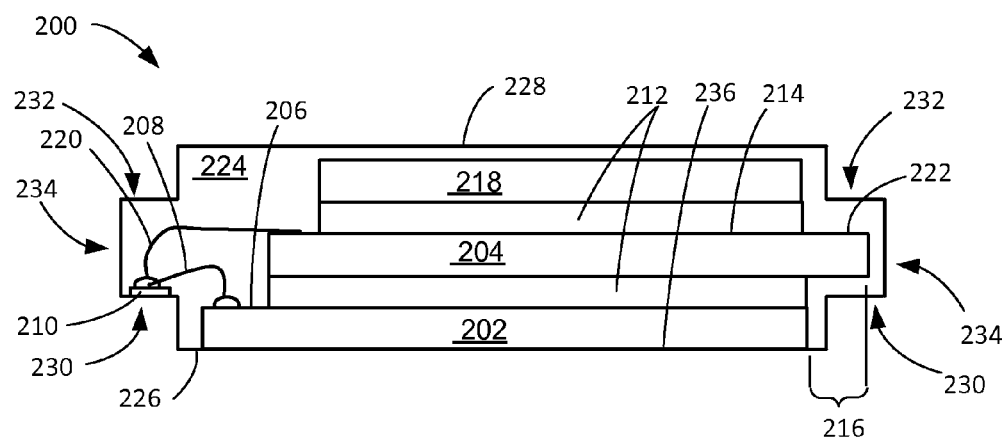
FIG. 2 is a cross-sectional view of a stackable integrated circuit package system along a line segment 2-2 of FIG. 1 in an embodiment of the present invention.

Referring now to FIG. 2, therein is shown a cross-sectional view of a stackable integrated circuit package system 200 along a line segment 2-2 of FIG. 1 in an embodiment of the present invention. The cross-sectional view of the stackable integrated circuit package system 200 may represent the stackable integrated circuit package system 100 of FIG. 1. The stackable integrated circuit package system 200 has a first integrated circuit die 202 below a second integrated circuit die 204 in an offset configuration. For illustrative purposes, the stackable integrated circuit package system 200 is described having the first integrated circuit die 202 and the second integrated circuit die 204, although it is understood that the stackable integrated circuit package system 200 may have other types of devices, such as passive devices or packaged devices.

The offset configuration exposes a portion of a first active side 206 of the first integrated circuit die 202. First interconnects 208, such as bond wires, connect between the first active side 206 and external interconnects 210, such as lands or terminal pads. The first integrated circuit die 202 is positioned below first external interconnect 210.

A spacer 212, such as a film adhesive, attaches the second integrated circuit die 204 over the first integrated circuit die 202 in an offset exposing the portion of the first active side 206. The spacer 212 is between the first active side 206 and a second non-active side 214 of the second integrated circuit die 204.

The offset configuration provides an overhang 216 of the second integrated circuit die 204 over the first integrated circuit die 202. Second interconnects 220, such as bond wires or ribbon bond wires, connect a second active side 222 of the second integrated circuit die 204 and the external interconnects 210.

A stiffener 218, such as a dummy die, heat slug, or spacer, may be placed over the second active side 222 with the spacer 212 in between. The stiffener 218 may serve a number of functions, such as providing planar rigidity for mechanical support, providing a space separation, providing a heat dissipation path, or providing an electromagnetic interference (EMI) shield. The spacer 212 and the stiffener 218 does not impede the connections of the second interconnects 220 and the second active side 222.

For illustrative purposes, the spacer 212 is depicted as substantially the same type between the first integrated circuit die 202 and the second integrated circuit die 204 as well as between the second integrated circuit die 204 and the stiffener 218. Although, it is understood that the spacer 212 may not be the same between the first integrated circuit die 202 and the second integrated circuit die 204 with the one between the second integrated circuit die 204 and the stiffener 218.

A recessed encapsulation 224, such as an epoxy mold compound, has a first non-planar side 226 and a second non-planar side 228 at a side opposite the first non-planar side 226. The first non-planar side 226 and the second non-planar side 228 has a first recess 230 and a second recess 232, respectively, in the recessed encapsulation 224 along package sides 234 of the stackable integrated circuit package system 200 opposite of each other.

For illustrative purposes, the recessed encapsulation 224 has the first recess 230 from the first non-planar side 226 at both of the package sides 234, although it is understood that the recessed encapsulation 224 may have different configurations than the first recess 230 from the first non-planar side 226 at the package sides 234. Also for illustrative purposes, the recessed encapsulation 224 has the second recess 232 from the second non-planar side 228 at both of the package sides 234, although it is understood that the recessed encapsulation 224 may have different configurations than the second recess 232 from the second non-planar side 228 at the package sides 234.

The recessed encapsulation 224 covers the second integrated circuit die 204, the spacer 212, the stiffener 218, the first interconnects 208, and the second interconnects 220. The recessed encapsulation 224 partially covers the first integrated circuit die 202 and the external interconnects 210. A first non-active side 236 of the first integrated circuit die 202 is exposed by and coplanar with the first non-planar side 226 and may serve as a heat dissipation surface. The external interconnects 210 are exposed by and coplanar with the first recess 230 but are not coplanar with the exposed surface of the first non-active side 236 of the first integrated circuit die 202. Neither the first integrated circuit die 202 nor the external interconnects 210 extend beyond the recessed encapsulation 224 since only a bottom surface of the external interconnect 210 and a bottom side of the first integrated circuit die 202 are entirely exposed from the recessed encapsulant 224. The stackable integrated circuit package system 200 is a symmetrical structure. The bottom surface of the first external interconnect 210 is exposed by the first recess 230 at an outer extent of a bottom surface of the recessed encapsulant 224.

Figure 3:
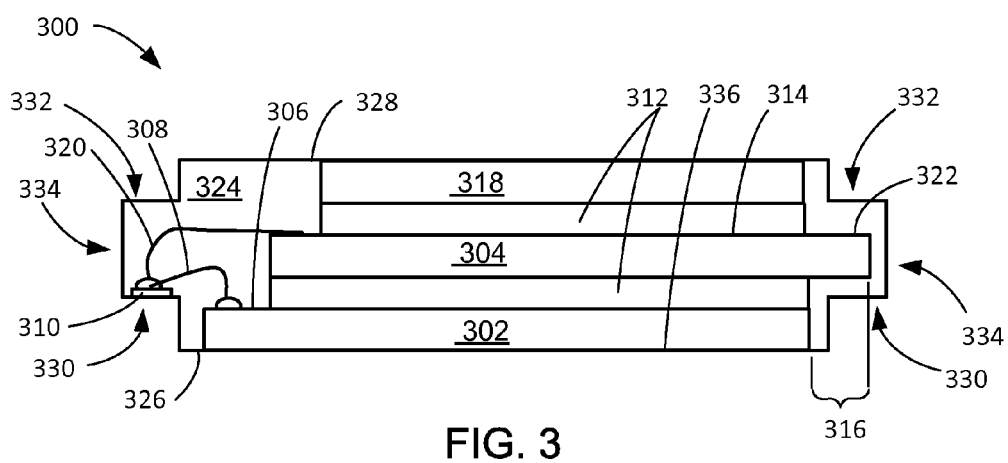
FIG. 3 is a cross-sectional view of a stackable integrated circuit package system along a line segment 2-2 of FIG. 1 in an alternative embodiment of the present invention.

Referring now to FIG. 3, therein is shown a cross-sectional view of a stackable integrated circuit package system 300 along a line segment 2-2 of FIG. 1 in an alternative embodiment of the present invention. The cross-sectional view of the stackable integrated circuit package system 300 may represent the stackable integrated circuit package system 100 of FIG. 1. The stackable integrated circuit package system 300 has a first integrated circuit die 302 below a second integrated circuit die 304 in an offset configuration. For illustrative purposes, the stackable integrated circuit package system 300 is described having the first integrated circuit die 302 and the second integrated circuit die 304, although it is understood that the stackable integrated circuit package system 300 may have other types of devices, such as passive devices or packaged devices.

The offset configuration exposes a portion of a first active side 306 of the first integrated circuit die 302. First interconnects 308, such as bond wires, connect between the first active side 306 and external interconnects 310, such as lands or terminal pads.

A spacer 312, such as a film adhesive, attaches the second integrated circuit die 304 over the first integrated circuit die 302 in an offset exposing the portion of the first active side 306. The spacer 312 is between the first active side 306 and a second non-active side 314 of the second integrated circuit die 304.

The offset configuration provides an overhang 316 of the second integrated circuit die 304 over the first integrated circuit die 302. Second interconnects 320, such as bond wires or ribbon bond wires, connect a second active side 322 of the second integrated circuit die 304 and the external interconnects 310.

A stiffener 318, such as a dummy die, heat slug, or spacer, may be placed over the second active side 322 with the spacer 312 in between. The stiffener 318 may serve a number of functions, such as providing planar rigidity for mechanical support, providing a space separation, providing a heat dissipation path, or providing an electromagnetic interference (EMI) shield. The spacer 312 and the stiffener 318 does not impede the connections of the second interconnects 320 and the second active side 322.

For illustrative purposes, the spacer 312 is depicted as substantially the same type between the first integrated circuit die 302 and the second integrated circuit die 304 as well as between the second integrated circuit die 304 and the stiffener 318. Although, it is understood that the spacer 312 may not be the same between the first integrated circuit die 302 and the second integrated circuit die 304 with the one between the second integrated circuit die 304 and the stiffener 318.

A recessed encapsulation 324, such as an epoxy mold compound, has a first non-planar side 326 and a second non-planar side 328 at a side opposite the first non-planar side 326. The first non-planar side 326 and the second non-planar side 328 has a first recess 330 and a second recess 332, respectively, in the recessed encapsulation 324 along package sides 334 of the stackable integrated circuit package system 300 opposite of each other.

For illustrative purposes, the recessed encapsulation 324 has the first recess 330 from the first non-planar side 326 at both of the package sides 334, although it is understood that the recessed encapsulation 324 may have different configurations than the first recess 330 from the first non-planar side 326 at the package sides 334. Also for illustrative purposes, the recessed encapsulation 324 has the second recess 332 from the second non-planar side 328 at both of the package sides 334, although it is understood that the recessed encapsulation 324 may have different configurations than the second recess 332 from the second non-planar side 328 at the package sides 334.

The recessed encapsulation 324 covers the second integrated circuit die 304, the spacer 312, the first interconnects 308, and the second interconnects 320. The recessed encapsulation 324 partially covers the first integrated circuit die 302, the external interconnects 310, and the stiffener 318. A first non-active side 336 of the first integrated circuit die 302 is exposed to ambient at the first non-planar side 326 and may serve as a heat dissipation surface. The stiffener 318 is exposed to ambient at the second non-planar side 328. The external interconnects 310 are exposed at the first recess 330. The stackable integrated circuit package system 300 is a symmetrical structure.

Figure 4:
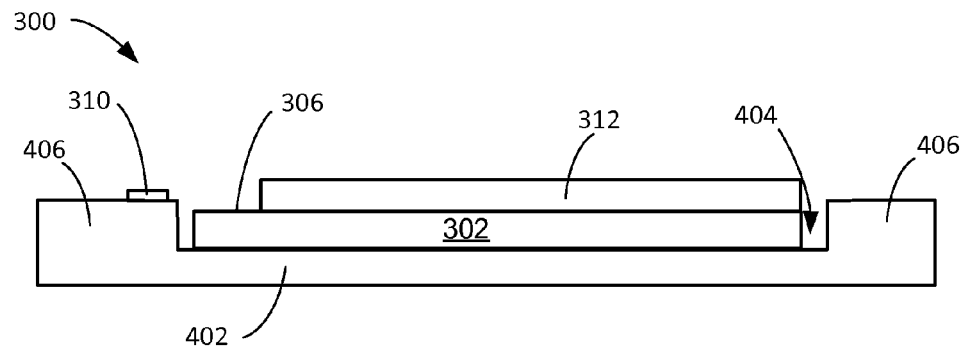
FIG. 4 is a cross-sectional view of the stackable integrated circuit package system of FIG. 2 in a die-attach phase.

Referring now to FIG. 4, therein is shown a cross-sectional view of the stackable integrated circuit package system 300 of FIG. 3 in a die-attach phase. The cross-sectional view depicts a mounting structure 402, such as a lead frame comprised of copper alloy or nickel palladium alloy, having a recess 404 surrounded by non-recessed ends 406.

The first integrated circuit die 302 is mounted in the recess 404. The spacer 312 is placed on the first active side 306 exposing a portion of the first active side 306 for further connections. The external interconnects 310 is formed on one of the non-recessed ends 406 of the mounting structure 402.

Figure 5:
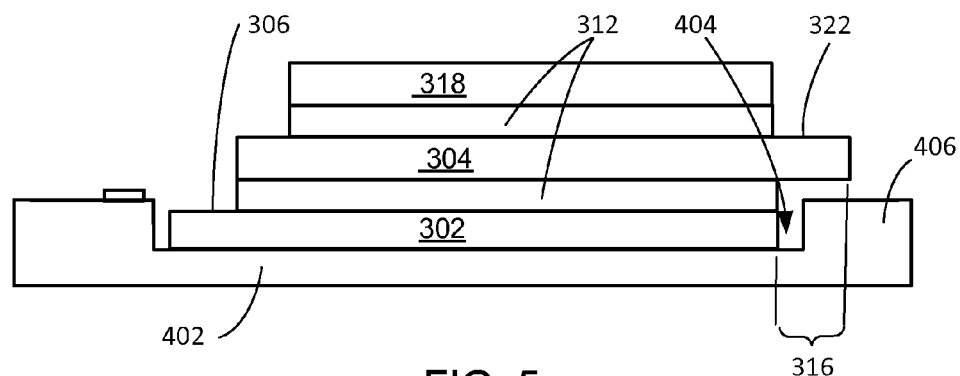
FIG. 5 is the structure of FIG. 4 in a stacking phase.

Referring now to FIG. 5, therein is shown the structure of FIG. 4 in a stacking phase. The second integrated circuit die 304 is attached over the first integrated circuit die 302 with the spacer 312 in between. The second integrated circuit die 304 is mounted in an offset configuration forming the overhang 316 from the first integrated circuit die 302. The offset configuration exposes the first active side 306 for further connections. The overhang 316 extends the second integrated circuit die 304 beyond the recess 404 and above one of the non-recessed ends 406 of the mounting structure 402.

The stiffener 318 is attached over the second integrated circuit die 304 with the spacer 312 in between. The stiffener 318 and the spacer 312 exposes a portion of the second active side 322 for further connections.

Figure 6:
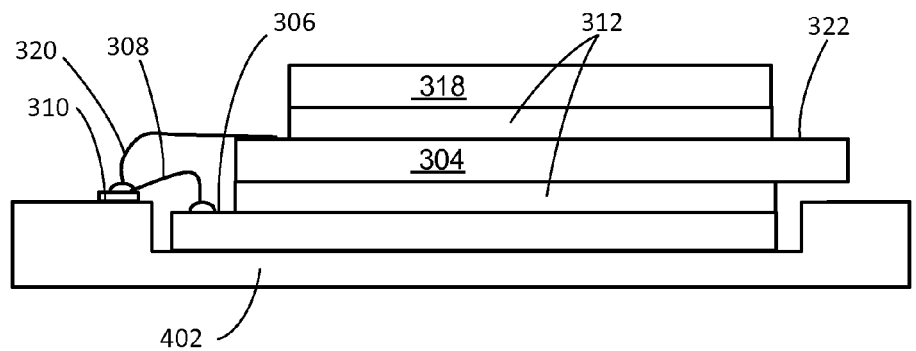
FIG. 6 is the structure of FIG. 5 in an interconnect-attach phase.

Referring now to FIG. 6, therein is shown the structure of FIG. 5 in an interconnect-attach phase. The first interconnects 308 are attached between the first active side 306 and the external interconnects 310 on the mounting structure 402. The second interconnects 320 are attached between the second active side 322 and the external interconnects 310. The first interconnects 308 and the second interconnects 320 may be attached by a number of different processes, such as wire bonding or ribbon wire bonding. The stiffener 318 and the spacer 312 are over the second integrated circuit die 304.

Figure 7:
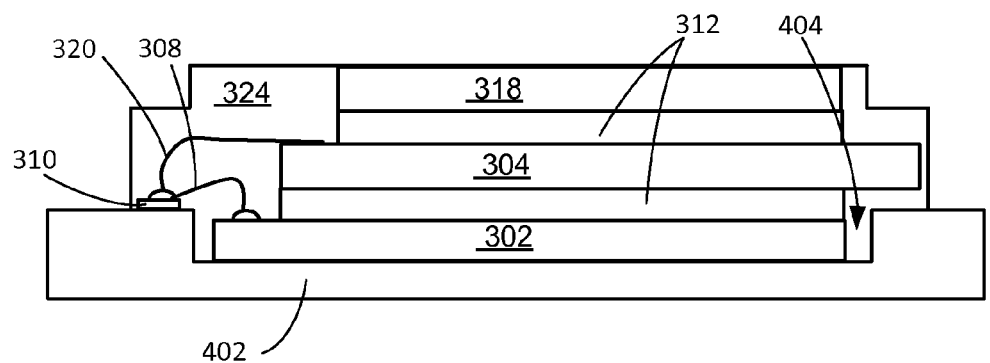
FIG. 7 is the structure of FIG. 6 in a molding phase.

Referring now to FIG. 7, therein is shown the structure of FIG. 6 in a molding phase. The offset stacked structure has the first integrated circuit die 302 in the recess 404 and attached to the second integrated circuit die 304 with the spacer 312 as well as the stiffener 318 over the second integrated circuit die 304. The offset stacked structure also has the first interconnects 308 and the second interconnects 320 attached to the external interconnects 310 on the mounting structure 402.

The offset stacked structure and the external interconnects 310 undergo a molding process. The molding process includes a post mold cure forming the recessed encapsulation 324 above the mounting structure 402. The mounting structure 402 serves as a mold.

Figure 8:
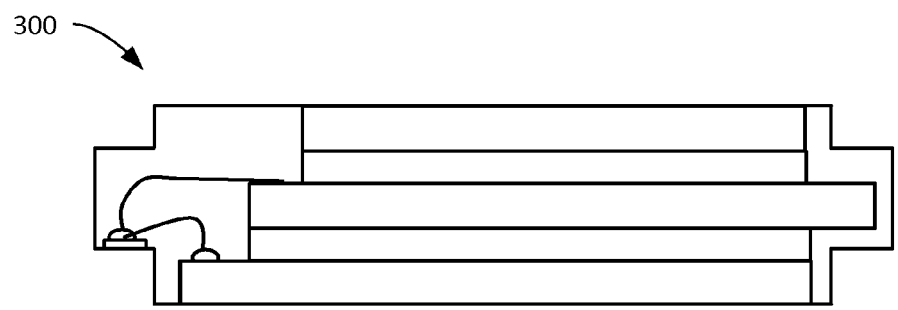
FIG. 8 is the structure of FIG. 7 in a singulation phase.

Referring now to FIG. 8, therein is shown the structure of FIG. 7 in a singulation phase. The mounting structure 402 of FIG. 7 is removed and the molded structure is singulated forming the stackable integrated circuit package system 300. A similar process may be used to form the stackable integrated circuit package system 200 of FIG. 2 with some variations.

Figure 9:
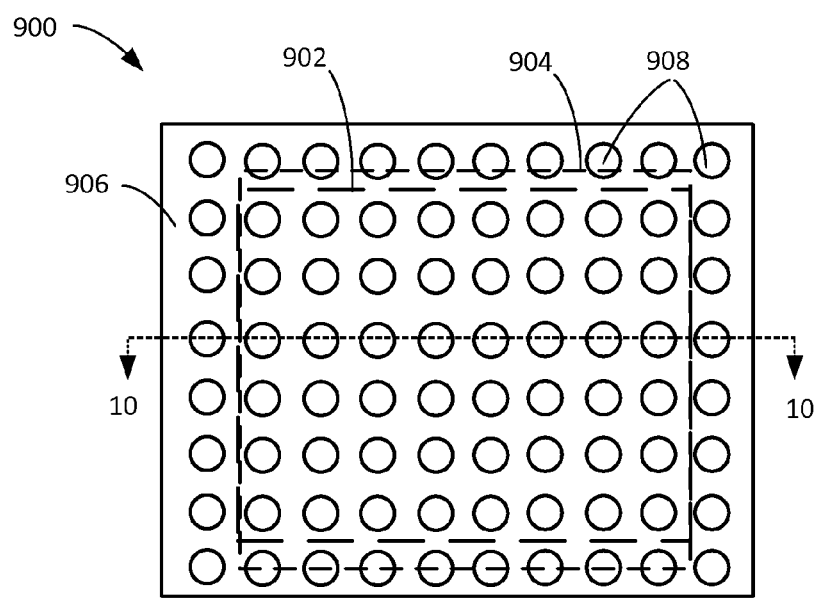
FIG. 9 is a plan view of a stacked integrated circuit package-in-package system in an application of an embodiment of the present invention.

Referring now to FIG. 9, therein is shown a plan view of a stacked integrated circuit package-in-package system 900 in an application of an embodiment of the present invention. The stacked integrated circuit package-in-package system 900 includes a first stackable integrated circuit package system 902 and a second stackable integrated circuit package system 904. The first stackable integrated circuit package system 902 stacked and the second stackable integrated circuit package system 904 may represent the stackable integrated circuit package system 300 of FIG. 3.

The stacked integrated circuit package-in-package system 900 includes a substrate 906, such as a laminate substrate. Package interconnects 908, such as solder balls, are in the substrate 906. For illustrative purposes, the first stackable integrated circuit package system 902 and the second stackable integrated circuit package system 904 are shown different sizes, although it is understood that the first stackable integrated circuit package system 902 and the second stackable integrated circuit package system 904 may not be different. Also for illustrative purposes, the package interconnects 908 are shown in an array configurations, although it is understood that the package interconnects 908 may be in a different configuration.

Figure 10:
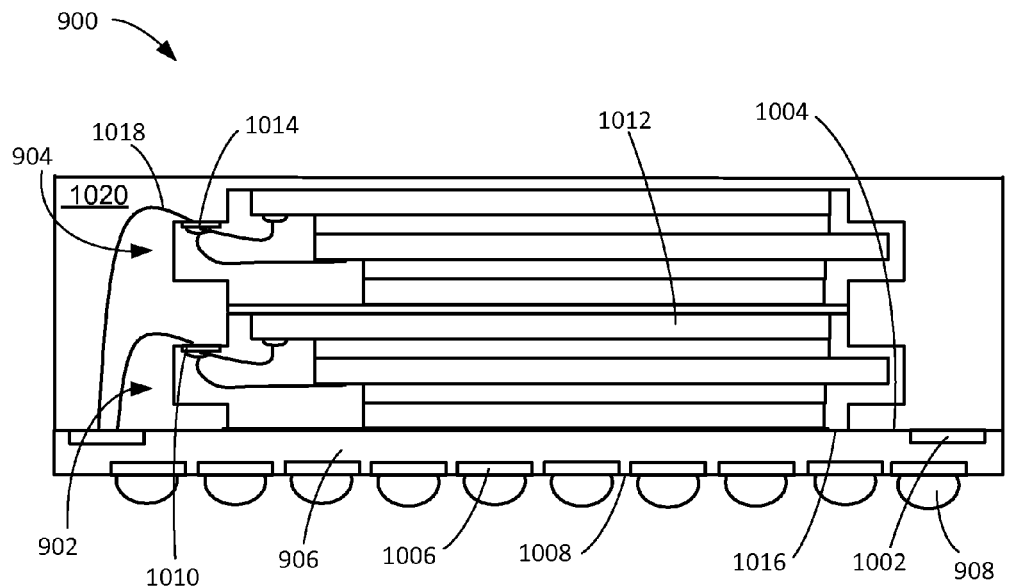
FIG. 10 is a cross-sectional view of the stacked integrated circuit package-in-package system along a line segment 10-10 of FIG. 9.

Referring now to FIG. 10, therein is shown a cross-sectional view of the stacked integrated circuit package-in-package system 900 along a line segment 10-10 of FIG. 9. The stacked integrated circuit package-in-package system 900 utilizing the first stackable integrated circuit package system 902 and the second stackable integrated circuit package system 904 decreases package size, simplifies manufacturing process, increases yield, and reduces the overall cost.

The substrate 906 includes top contacts 1002 at a top surface 1004 and bottom contacts 1006 at a bottom surface 1008. The package interconnects 908 attach to the bottom contacts 1006. For illustrative purposes, the substrate 906 is shown as having the top contacts 1002 and the bottom contacts 1006, although it is understood that the substrate 906 may have other structures, such as one or more routing layers or electrical vias.

The first stackable integrated circuit package system 902 having first external interconnects 1010 is over the top surface 1004. A stiffener side 1016 of the first stackable integrated circuit package system 902 is attached on the top surface 1004. Internal interconnects 1018, such as bond wires, connect the first external interconnects 1010 and the top contacts 1002.

The second stackable integrated circuit package system 904 is stacked above the first stackable integrated circuit package system 902. A first integrated circuit die 1012 of the first stackable integrated circuit package system 902 is exposed and serves as a spacer for the connections of the internal interconnects 1018 and the first external interconnects 1010. The stacked structure with the first stackable integrated circuit package system 902 and the second stackable integrated circuit package system 904 provides a balanced structure preventing tilting damage during wire bonding process.

The internal interconnects 1018 also connect second external interconnects 1014 of the second stackable integrated circuit package system 904 and the top contacts 1002. For illustrative purposes, the internal interconnects 1018 shown used for connections to both the first external interconnects 1010 and the second external interconnects 1014, although it is understood that the type of the internal interconnects 1018 for connections the first external interconnects 1010 and the second external interconnects 1014 may differ, such as bond wires or ribbon bond wires.

A package encapsulation 1020, such as an epoxy molding compound, covers the first stackable integrated circuit package system 902, the second stackable integrated circuit package system 904, the internal interconnects 1018, and the top surface 1004. For illustrative purposes, the package encapsulation 1020 is described completely covering the second stackable integrated circuit package system 904, although it is understood that the package encapsulation 1020 may expose a portion of the second stackable integrated circuit package system 904.

The first stackable integrated circuit package system 902 and the second stackable integrated circuit package system 904 may be tested without assembly in the stacked integrated circuit package-in-package system 900 ensuring known good devices (KGD), increasing yield, and lowering cost.

Figure 11:
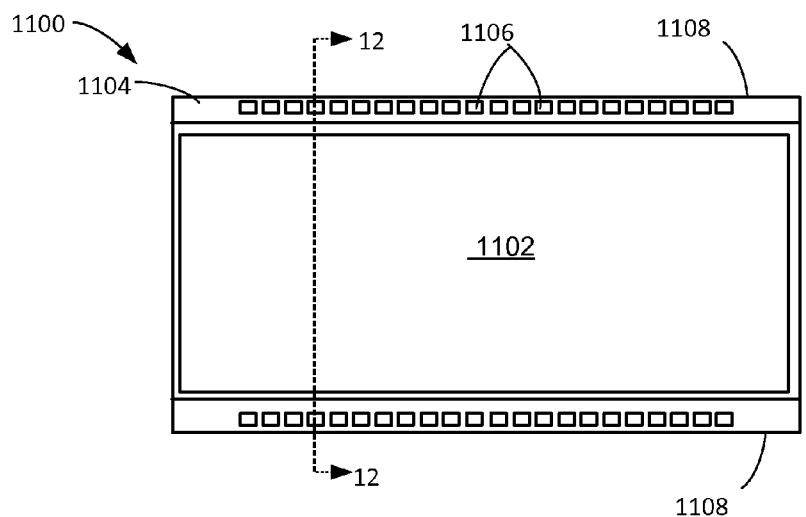
FIG. 11 is a bottom view of a stackable integrated circuit package system in another alternative embodiment of the present invention.

Referring now to FIG. 11, therein is shown a bottom view of a stackable integrated circuit package system 1100 in another alternative embodiment of the present invention. The stackable integrated circuit package system 1100, such as dual in-line package, has a first device 1102, such as an integrated circuit die or a packaged device, exposed in a device encapsulation 1104, such as an epoxy mold compound. External interconnects 1106, such as lands or terminal pads, are along package sides 1108 opposite to each other of the stackable integrated circuit package system 1100 in the device encapsulation 1104.

For illustrative purposes, the stackable integrated circuit package system 1100 is shown having the external interconnects 1106 in single rows, although it understood that the stackable integrated circuit package system 1100 may have the external interconnects 1106 in a different configuration, such as multiple rows for each of the package sides 1108.

Figure 12:
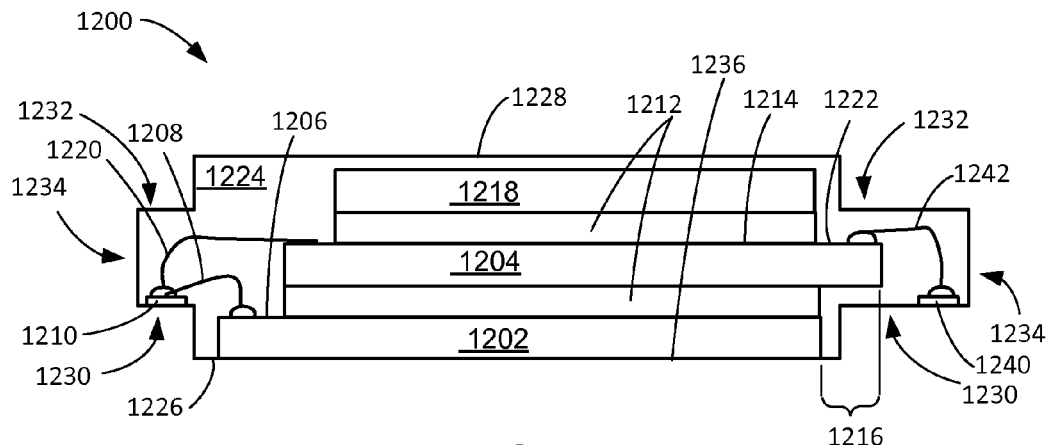
FIG. 12 is a cross-sectional view of a stackable integrated circuit package system along a line segment 12-12 of FIG. 11 in yet another alternative embodiment of the present invention.

Referring now to FIG. 12, therein is shown a cross-sectional view of a stackable integrated circuit package system 1200 along a line segment 12-12 of FIG. 11 in yet another alternative embodiment of the present invention. The cross-sectional view of the stackable integrated circuit package system 1200 may represent the stackable integrated circuit package system 1100 of FIG. 11. The stackable integrated circuit package system 1200 has a first integrated circuit die 1202 below a second integrated circuit die 1204 in an offset configuration. For illustrative purposes, the stackable integrated circuit package system 1200 is described having the first integrated circuit die 1202 and the second integrated circuit die 1204, although it is understood that the stackable integrated circuit package system 1200 may have other types of devices, such as passive devices or packaged devices.

The offset configuration exposes a portion of a first active side 1206 of the first integrated circuit die 1202. First interconnects 1208, such as bond wires, connect between the first active side 1206 and first external interconnects 1210, such as lands or terminal pads.

A spacer 1212, such as a film adhesive, attaches the second integrated circuit die 1204 over the first integrated circuit die 1202 in an offset exposing the portion of the first active side 1206. The spacer 1212 is between the first active side 1206 and a second non-active side 1214 of the second integrated circuit die 1204.

The offset configuration provides an overhang 1216 of the second integrated circuit die 1204 over the first integrated circuit die 1202. The overhang 1216 also exposes second external interconnects 1240, such as lands or terminal pads, the stackable integrated circuit package system 1200. Second interconnects 1220, such as bond wires or ribbon bond wires, connect a second active side 1222 of the second integrated circuit die 1204 and the first external interconnects 1210. Third interconnects 1242, such as bond wires or ribbon bond wires, connect the second active side 1222 and the second external interconnects 1240.

A stiffener 1218, such as a dummy die, heat slug, or spacer, may be placed over the second active side 1222 with the spacer 1212 in between. The stiffener 1218 may serve a number of functions, such as providing planar rigidity for mechanical support, providing a space separation, providing a heat dissipation path, or providing an electromagnetic interference (EMI) shield. The spacer 1212 and the stiffener 1218 does not impede the connections of the second interconnects 1220 and the third interconnects 1242 with the second active side 1222.

A recessed encapsulation 1224, such as an epoxy mold compound, has a first non-planar side 1226 and a second non-planar side 1228 at a side opposite the first non-planar side 1226. The first non-planar side 1226 and the second non-planar side 1228 has a first recess 1230 and a second recess 1232, respectively, in the recessed encapsulation 1224 along package sides 1234 of the stackable integrated circuit package system 1200 opposite of each other.

For illustrative purposes, the recessed encapsulation 1224 has the first recess 1230 from the first non-planar side 1226 at both of the package sides 1234, although it is understood that the recessed encapsulation 1224 may have different configurations than the first recess 1230 from the first non-planar side 1226 at the package sides 1234. Also for illustrative purposes, the recessed encapsulation 1224 has the second recess 1232 from the second non-planar side 1228 at both of the package sides 1234, although it is understood that the recessed encapsulation 1224 may have different configurations than the second recess 1232 from the second non-planar side 1228 at the package sides 1234.

The recessed encapsulation 1224 covers the second integrated circuit die 1204, the spacer 1212, the stiffener 1218, the first interconnects 1208, the second interconnects 1220, and the third interconnects 1242. The recessed encapsulation 1224 partially covers the first integrated circuit die 1202, the first external interconnects 1210, and the second external interconnects 1240. A first non-active side 1236 of the first integrated circuit die 1202 is exposed to ambient at the first non-planar side 1226 and may serve as a heat dissipation surface. The first external interconnects 1210 are exposed at the first recess 1230. The second external interconnects 1240 are exposed at the second recess 1232. The stackable integrated circuit package system 1200 is a symmetrical structure.

Figure 13:
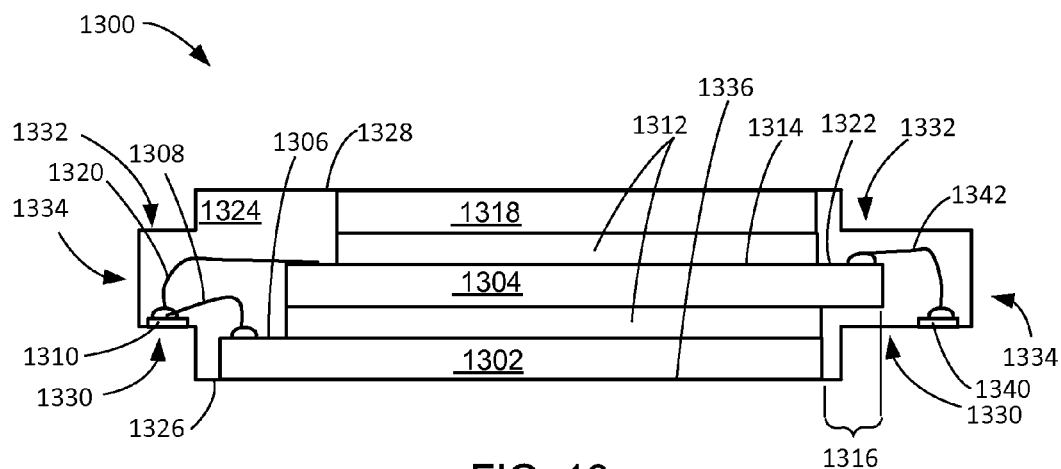
FIG. 13 is a cross-sectional view of a stackable integrated circuit package system along a line segment 12-12 of FIG. 11 in yet another alternative embodiment of the present invention.

Referring now to FIG. 13, therein is shown a cross-sectional view of a stackable integrated circuit package system 1300 along a line segment 12-12 of FIG. 11 in yet another alternative embodiment of the present invention. The cross-sectional view of the stackable integrated circuit package system 1300 may represent the stackable integrated circuit package system 1100 of FIG. 11. The stackable integrated circuit package system 1300 has a first integrated circuit die 1302 below a second integrated circuit die 1304 in an offset configuration. For illustrative purposes, the stackable integrated circuit package system 1300 is described having the first integrated circuit die 1302 and the second integrated circuit die 1304, although it is understood that the stackable integrated circuit package system 1300 may have other types of devices, such as passive devices or packaged devices.

The offset configuration exposes a portion of a first active side 1306 of the first integrated circuit die 1302. First interconnects 1308, such as bond wires, connect between the first active side 1306 and first external interconnects 1310, such as lands or terminal pads.

A spacer 1312, such as a film adhesive, attaches the second integrated circuit die 1304 over the first integrated circuit die 1302 in an offset exposing the portion of the first active side 1306. The spacer 1312 is between the first active side 1306 and a second non-active side 1314 of the second integrated circuit die 1304.

The offset configuration provides an overhang 1316 of the second integrated circuit die 1304 over the first integrated circuit die 1302. The overhang 1316 also exposes second external interconnects 1340, such as lands or terminal pads, the stackable integrated circuit package system 1300. Second interconnects 1320, such as bond wires or ribbon bond wires, connect a second active side 1322 of the second integrated circuit die 1304 and the first external interconnects 1310. Third interconnects 1342, such as bond wires or ribbon bond wires, connect the second active side 1322 and the second external interconnects 1340.

A stiffener 1318, such as a dummy die, heat slug, or spacer, may be placed over the second active side 1322 with the spacer 1312 in between. The stiffener 1318 may serve a number of functions, such as providing planar rigidity for mechanical support, providing a space separation, providing a heat dissipation path, or providing an electromagnetic interference (EMI) shield. The spacer 1312 and the stiffener 1318 does not impede the connections of the second interconnects 1320 and the third interconnects 1342 with the second active side 1322.

A recessed encapsulation 1324, such as an epoxy mold compound, has a first non-planar side 1326 and a second non-planar side 1328 at a side opposite the first non-planar side 1326. The first non-planar side 1326 and the second non-planar side 1328 has a first recess 1330 and a second recess 1332, respectively, in the recessed encapsulation 1324 along package sides 1334 of the stackable integrated circuit package system 1300 opposite of each other.

The recessed encapsulation 1324 covers the second integrated circuit die 1304, the spacer 1312, the first interconnects 1308, the second interconnects 1320, and the third interconnects 1342. The recessed encapsulation 1324 partially covers the first integrated circuit die 1302, the first external interconnects 1310, the stiffener 1318, and the second external interconnects 1340. A first non-active side 1336 of the first integrated circuit die 1302 is exposed to ambient at the first non-planar side 1326. The first non-active side 1336 may serve as a heat dissipation surface. The first external interconnects 1310 and the second external interconnects 1340 are also exposed at the first non-planar side 1326. The stackable integrated circuit package system 1300 is a symmetrical structure.

Figure 14:
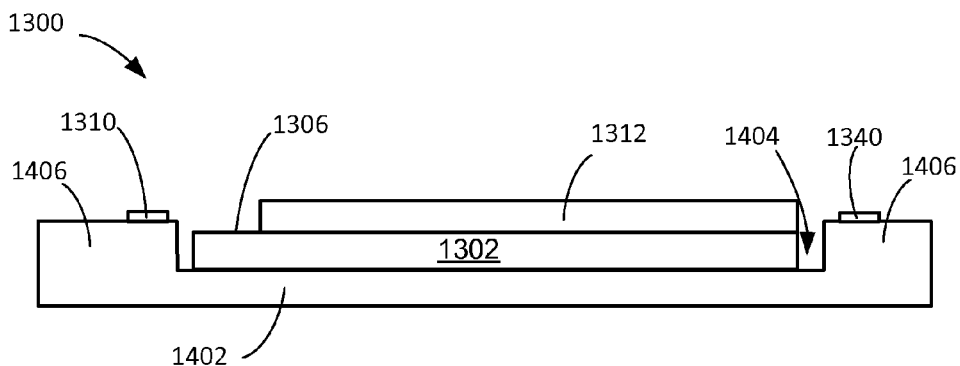
FIG. 14 is a cross-sectional view of the stackable integrated circuit package system of FIG. 13 in a first die-attach phase.

Referring now to FIG. 14, therein is shown a cross-sectional view of the stackable integrated circuit package system 1300 of FIG. 13 in a first die-attach phase. The cross-sectional view depicts a mounting structure 1402, such as a lead frame comprised of copper alloy or nickel palladium alloy, having a recess 1404 surrounded by non-recessed ends 1406.

The first integrated circuit die 1302 is mounted in the recess 1404. The spacer 1312 is placed on the first active side 1306 exposing a portion of the first active side 1306 for further connections. The first external interconnects 1310 and the second external interconnects 1340 are formed on the non-recessed ends 1406 of the mounting structure 1402.

Figure 15:
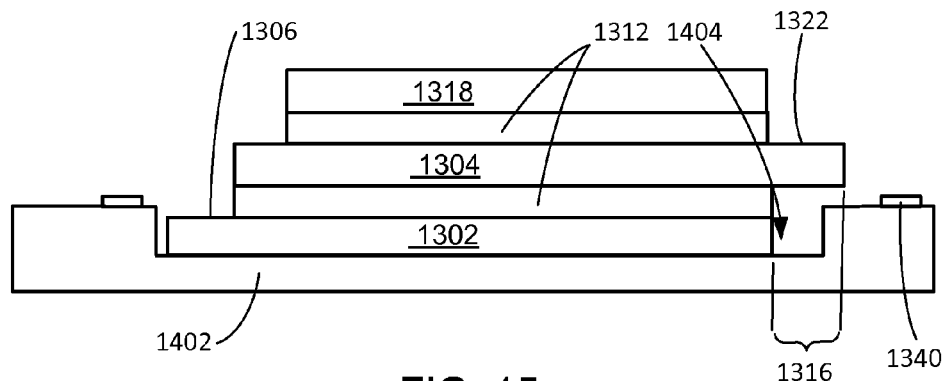
FIG. 15 is the structure of FIG. 14 in a second die-attach phase.

Referring now to FIG. 15, therein is shown the structure of FIG. 14 in a second die-attach phase. The second integrated circuit die 1304 is attached over the first integrated circuit die 1302 with the spacer 1312 in between. The second integrated circuit die 1304 is mounted in an offset configuration forming the overhang 1316 from the first integrated circuit die 1302. The offset configuration exposes the first active side 1306 for further connections. The overhang 1316 extends the second integrated circuit die 1304 beyond the recess 1404 and above the second external interconnects 1340 on the mounting structure 1402.

The stiffener 1318 is attached over the second integrated circuit die 1304 with the spacer 1312 in between. The stiffener 1318 and the spacer 1312 exposes a portion of the second active side 1322 for further connections.

Figure 16:
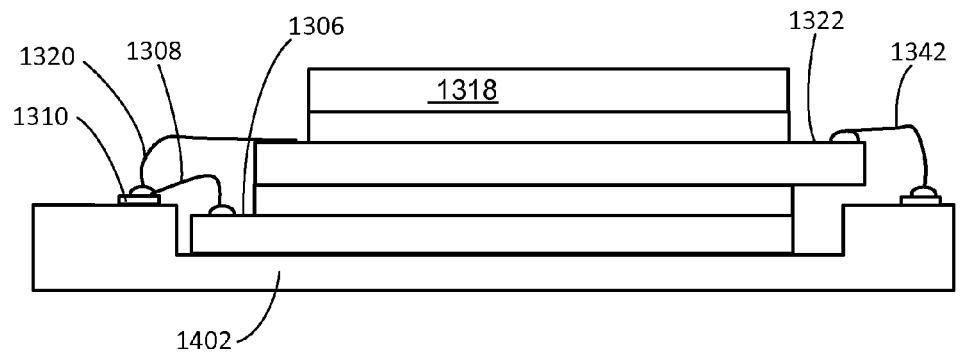
FIG. 16 is the structure of FIG. 15 in an interconnect-attach phase.

Referring now to FIG. 16, therein is shown the structure of FIG. 15 in an interconnect-attach phase. The first interconnects 1308 are attached between the first active side 1306 and the first external interconnects 1310 on the mounting structure 1402. The second interconnects 1320 are attached between the second active side 1322 and the first external interconnects 1310. The third interconnects 1342 are attached between the second active side 1322 and the second external interconnects 1340. The first interconnects 1308, the second interconnects 1320, and the third interconnects 1342 may be attached by a number of different processes, such as wire bonding or ribbon wire bonding.

Figure 17:
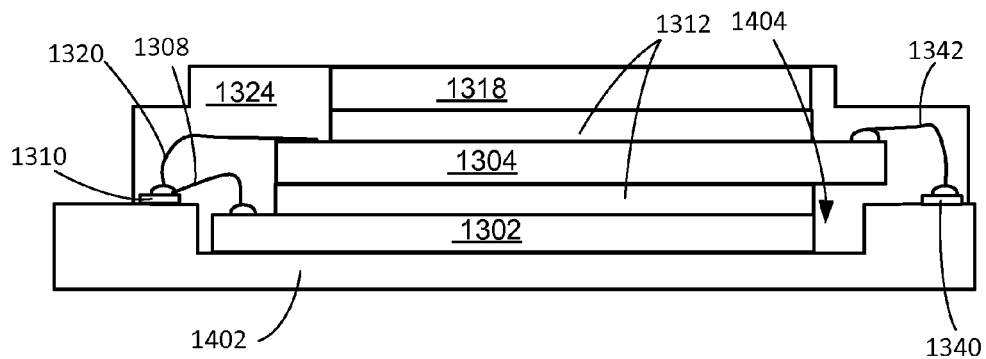
FIG. 17 is the structure of FIG. 16 in a molding phase.

Referring now to FIG. 17, therein is shown the structure of FIG. 16 in a molding phase. The offset stacked structure has the first integrated circuit die 1302 in the recess 1404 and the second integrated circuit die 1304 attached to the first integrated circuit die 1302 with the spacer 1312 in between as well as the stiffener 1318 over the second integrated circuit die 1304. The offset stacked structure also has the first interconnects 1308 and the second interconnects 1320 attached to the first external interconnects 1310. The third interconnects 1342 are attached to the second external interconnects 1340. The first external interconnects 1310 and the second external interconnects 1340 are on the mounting structure 1402.

The offset stacked structure, the first external interconnects 1310 and the second external interconnects 1340 undergo a molding process. The molding process includes a post mold cure forming the recessed encapsulation 1324 above the mounting structure 1402. The mounting structure 1402 serves as a mold.

Figure 18:
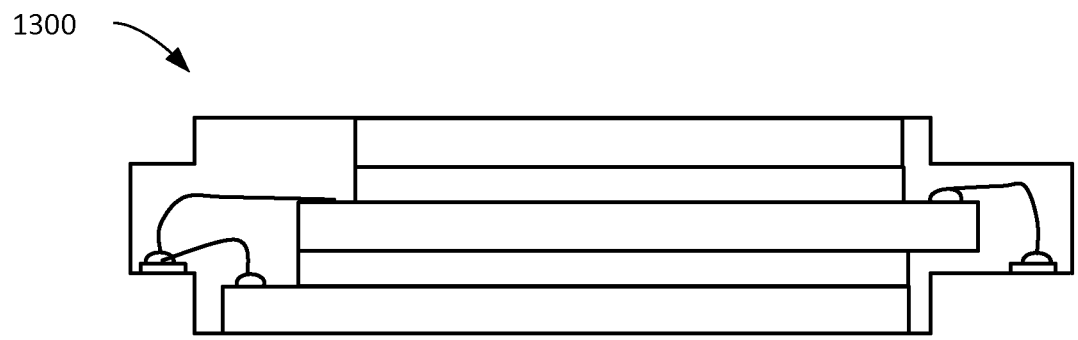
FIG. 18 is the structure of FIG. 17 in a singulation phase.

Referring now to FIG. 18, therein is shown the structure of FIG. 17 in a singulation phase. The mounting structure 1402 of FIG. 17 is removed and the molded structure is singulated forming the stackable integrated circuit package system 1300. A similar process may be used to form the stackable integrated circuit package system 1200 of FIG. 12 with some variations.

Figure 19:
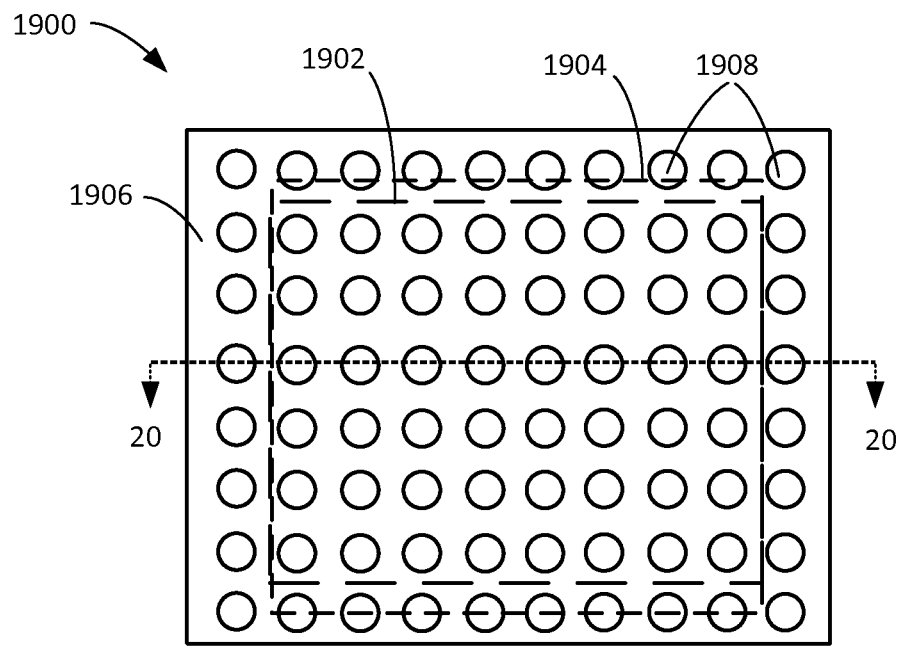
FIG. 19 is a plan view of a stacked integrated circuit package-in-package system in an application of another alternative embodiment of the present invention.

Referring now to FIG. 19, therein is shown a plan view of a stacked integrated circuit package-in-package system 1900 in an application of another alternative embodiment of the present invention. The stacked integrated circuit package-in-package system 1900 includes a first stackable integrated circuit package system 1902 and a second stackable integrated circuit package system 1904. The first stackable integrated circuit package system 1902 stacked and the second stackable integrated circuit package system 1904 may represent the stackable integrated circuit package system 1300 of FIG. 13.

The stacked integrated circuit package-in-package system 1900 includes a substrate 1906, such as a laminate substrate. Package interconnects 1908, such as solder balls, are in the substrate 1906. For illustrative purposes, the first stackable integrated circuit package system 1902 and the second stackable integrated circuit package system 1904 are shown different sizes, although it is understood that the first stackable integrated circuit package system 1902 and the second stackable integrated circuit package system 1904 may not be different. Also for illustrative purposes, the package interconnects 1908 are shown in an array configurations, although it is understood that the package interconnects 1908 may be in a different configuration.

Figure 20:
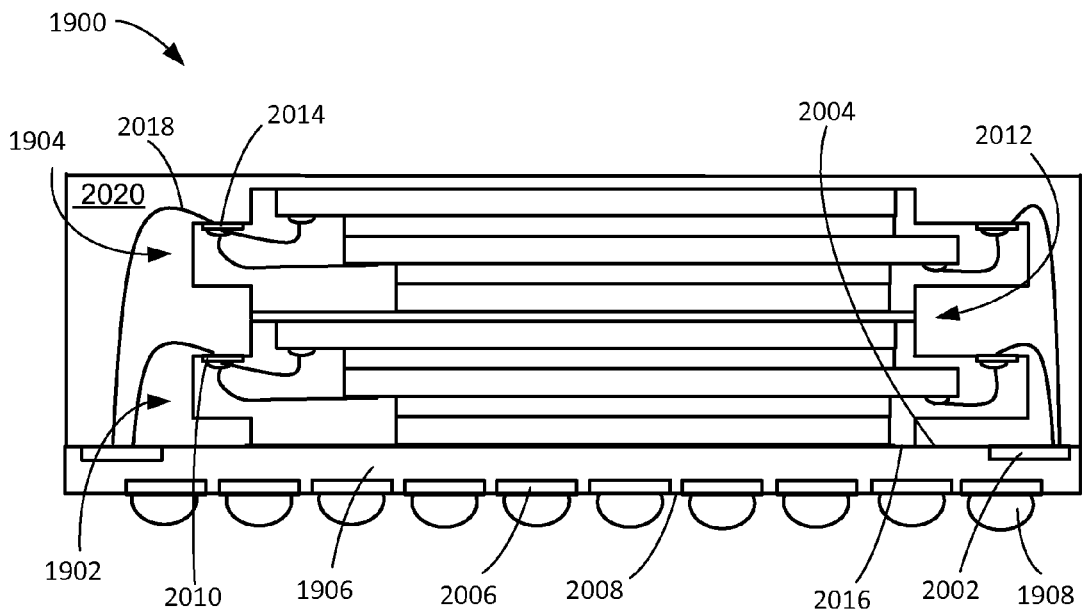
FIG. 20 is a cross-sectional view of the stacked integrated circuit package-in-package system along a line segment 20-20 of FIG. 19.

Referring now to FIG. 20, therein is shown a cross-sectional view of the stacked integrated circuit package-in-package system 1900 along a line segment 20-20 of FIG. 19. The stacked integrated circuit package-in-package system 1900 utilizing the first stackable integrated circuit package system 1902 and the second stackable integrated circuit package system 1904 decreases package size, simplifies manufacturing process, increases yield, and reduces the overall cost.

The substrate 1906 includes top contacts 2002 at a top surface 2004 and bottom contacts 2006 at a bottom surface 2008. The package interconnects 1908 attach to the bottom contacts 2006. For illustrative purposes, the substrate 1906 is shown as having the top contacts 2002 and the bottom contacts 2006, although it is understood that the substrate 1906 may have other structures, such as one or more routing layers or electrical vias.

The first stackable integrated circuit package system 1902 having first external interconnects 2010 is over the top surface 2004. A stiffener side 2016 of the first stackable integrated circuit package system 1902 is attached on the top surface 2004. Internal interconnects 2018, such as bond wires, connect the first external interconnects 2010 and the top contacts 2002.

The second stackable integrated circuit package system 1904 is stacked above the first stackable integrated circuit package system 1902 forming a stacked recess 2012. The stacked recess 2012 provides clearance for the connections of the internal interconnects 2018 and the first external interconnects 2010. The stacked structure with the first stackable integrated circuit package system 1902 and the second stackable integrated circuit package system 1904 provides a balanced structure preventing tilting damage during wire bonding process.

The internal interconnects 2018 also connect second external interconnects 2014 of the second stackable integrated circuit package system 1904 and the top contacts 2002. For illustrative purposes, the internal interconnects 2018 shown used for connections to both the first external interconnects 2010 and the second external interconnects 2014, although it is understood that the type of the internal interconnects 2018 for connections the first external interconnects 2010 and the second external interconnects 2014 may differ, such as bond wires or ribbon bond wires.

A package encapsulation 2020, such as an epoxy molding compound, covers the first stackable integrated circuit package system 1902, the second stackable integrated circuit package system 1904, the internal interconnects 2018, and the top surface 2004. For illustrative purposes, the package encapsulation 2020 is described completely covering the second stackable integrated circuit package system 1904, although it is understood that the package encapsulation 2020 may expose a portion of the second stackable integrated circuit package system 1904.

The first stackable integrated circuit package system 1902 and the second stackable integrated circuit package system 1904 may be tested without assembly in the stacked integrated circuit package-in-package system 1900 ensuring known good devices (KGD), increasing yield, and lowering cost.

Figure 21:
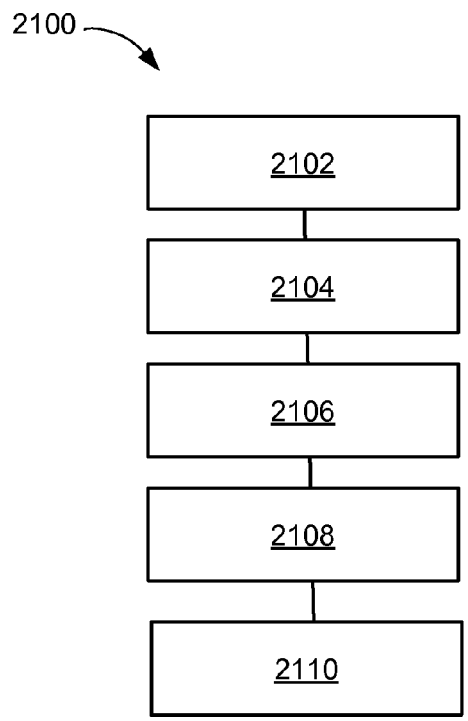
FIG. 21 is a flow chart of a stackable integrated circuit package system for manufacture of the stackable integrated circuit package system in an embodiment of the present invention.

Referring now to FIG. 21, therein is shown a flow chart of a stackable integrated circuit package system 2100 for manufacture of the stackable integrated circuit package system 100 in an embodiment of the present invention. The system 2100 includes forming a first external interconnect in a block 2102; positioning a first integrated circuit die below the first external interconnect in a block 2104; stacking a second integrated circuit die over the first integrated circuit die in an offset configuration not over the first external interconnect in a block 2106; connecting the first integrated circuit die with the first external interconnect in a block 2108; and encapsulating the second integrated circuit die with the first external interconnect and a first integrated circuit die partially exposed in a block 2110.

It has been discovered that the present invention thus has numerous aspects.

A principle aspect that has been unexpectedly discovered is that the present invention provides a stackable integrated circuit package system with reduced height and width, improved thermal performance, and lowered cost. The symmetric structure of the stackable integrated circuit package system provides planar rigidity to mitigate warpage while providing high input/output (I/O) connection options. The simplified manufacturing process provides a low profile molded package and may be further reduced with thin or ultra thin integrated circuit die.

Another aspect is that the present invention provides device connections to the substrate below the stacked devices in a symmetric configuration. The symmetric configuration supports the stackable integrated circuit package system in a stacked structure to withstand wire bonding force and prevent damage from tilting.

Yet another aspect of the present invention provides the stackable integrated circuit package system having the integrated circuit exposed serving as a spacer in a stacked structure resulting in a lower height of the package-in-package.

Yet another aspect of the present invention provides improved yield of the overall stacked package-in-package device. The stackable integrated circuit package system in the stacked package-in-package device may be tested ensuring known good device before assembly of the stacked package-in-package device.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stacked integrated circuit package-in-package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

Thus, it has been discovered that the stacked integrated circuit package-in-package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

What is claimed is:

1. A method of manufacturing a stackable integrated circuit package system comprising:
    forming a first external interconnect;
    positioning a first integrated circuit die below the first external interconnect;
    connecting the first integrated circuit die with the first external interconnect; and
    forming a recessed encapsulation, the recessed encapsulation on the first integrated circuit die and the first external interconnect, the recessed encapsulation having:
        a first recess at an outer extent of bottom and lower side surfaces of the recessed encapsulation, wherein only a bottom surface of the first external interconnect is exposed by the first recess and wherein a bottom side of the first integrated circuit die is entirely exposed at a bottom surface of the recessed encapsulation, the first recess along outermost bottom and lower side edges of the integrated circuit package system, and
        a second recess at an outer extent of top and upper side surfaces of the recessed encapsulation, the first external interconnect not exposed by the second recess, the second recess along outermost top and upper side edges of the integrated circuit package system.

2. The method as claimed in claim 1 further comprising stacking a second integrated circuit die over the first integrated circuit die, the second integrated circuit die offset from and not over the first external interconnect.

3. The method as claimed in claim 1 further comprising stacking a stiffener over the first integrated circuit die.

4. The method as claimed in claim 1 further comprising forming a second external interconnect; and
   wherein positioning the first integrated circuit die includes mounting the first integrated circuit die between the first external interconnect and a second external interconnect.

5. The method as claimed in claim 1 further comprising forming a stacked integrated circuit package-in-package system having a first stackable integrated circuit package system below a second stackable integrated circuit package system.

6. A method of manufacturing a stackable integrated circuit package system comprising:
   forming a first external interconnect at a package side;
   positioning a first integrated circuit die, having a first active side and a first non-active side, below the first external interconnect;
   stacking a second integrated circuit die over the first active side;
   connecting the first integrated circuit die with the first external interconnect; and
   forming a recessed encapsulation, the recessed encapsulation on the first integrated circuit die, the second integrated circuit die, and the first external interconnect, the recessed encapsulation having:
      a first recess at an outer extent of bottom and lower side surfaces of the recessed encapsulation, with only a bottom surface of the first external interconnect exposed by the first recess, and with the first non-active side of the first integrated circuit die entirely exposed at the bottom surface of the recessed encapsulation, the first recess along outermost bottom and lower edges of the integrated circuit package system, and
      a second recess at an outer extent of top and upper side surfaces of the recessed encapsulation, the first external interconnect not exposed by the second recess, the second recess along outermost toy and upper side edges of the integrated circuit package system.

7. The method as claimed in claim 6 wherein forming the recessed encapsulation includes forming the recessed encapsulation that is symmetrical.

8. The method as claimed in claim 6 wherein stacking the second integrated circuit die over the first active side includes attaching a spacer between the first integrated circuit die and the second integrated circuit die.

9. The method as claimed in claim 6 wherein stacking the second integrated circuit die over the first active side includes facing a second non-active side of the second integrated circuit die to the first active side.

10. The method as claimed in claim 6 further comprising stacking a stiffener over the first integrated circuit die, the stiffener partially covered by the recessed encapsulation.

11. A stackable integrated circuit package system comprising:
   a first external interconnect;
   a first integrated circuit die positioned below the first external interconnect;
   an internal interconnect between the first integrated circuit die and the first external interconnect; and
   a recessed encapsulation, the recessed encapsulation on the first integrated circuit die and the first external interconnect, the recessed encapsulation having:
      a first recess at an outer extent of bottom and lower side surfaces of the recessed encapsulation, wherein only a bottom surface of the first external interconnect is exposed by the first recess and wherein a bottom side of the first integrated circuit die is entirely exposed from a bottom surface of the recessed encapsulation, the first recess along outermost bottom and lower side edges of the integrated circuit package system, and
      a second recess at an outer extent of top and upper side surfaces of the recessed encapsulation, the first external interconnect not exposed by the second recess, the second recess along outermost top and upper side edges of the integrated circuit package system.

12. The system as claimed in claim 11 wherein:
the first external interconnect is at a package side;
the first integrated circuit die has a first active side and a first non-active side, the first integrated circuit die below the first external interconnect;
a second integrated circuit die over the first active side; and
the recessed encapsulation on the first integrated circuit die, the second integrated circuit die, and the first external interconnect with only the bottom surfaces of the first external interconnect and the first integrated circuit die are entirely exposed from the recessed encapsulant.

13. The system as claimed in claim 12 wherein the recessed encapsulation is symmetrical.

14. The system as claimed in claim 12 wherein the second integrated circuit die over the first active side has a spacer between the first integrated circuit die and the second integrated circuit die.

15. The system as claimed in claim 12 wherein the second integrated circuit die has a second non-active side facing and over the first active side.

16. The system as claimed in claim 12 wherein the first non-active side of the first integrated circuit die is exposed.

17. The system as claimed in claim 11 further comprising a second integrated circuit die over the first integrated circuit die, the second integrated circuit die offset from and not over the first external interconnect.

18. The system as claimed in claim 11 further comprising a stiffener over the first integrated circuit die.

19. The system as claimed in claim 11 further comprising a second integrated circuit die over the first integrated circuit die in an offset configuration not over the first external interconnect.

20. The system as claimed in claim 11 further comprising a stacked integrated circuit package-in-package system having a first stackable integrated circuit package system below a second stackable integrated circuit package system.

* * * * *